United States Patent [19]
Kono

[11] Patent Number: 5,516,023
[45] Date of Patent: May 14, 1996

[54] WIRE BONDING APPARATUS

[75] Inventor: Takashi Kono, Tokyo, Japan

[73] Assignee: NEC Corporation, Japan

[21] Appl. No.: 349,522

[22] Filed: Dec. 5, 1994

[30]     Foreign Application Priority Data

Dec. 6, 1993    [JP]    Japan .................. 5-305322

[51] Int. Cl.⁶ ............................................. H01L 21/60
[52] U.S. Cl. ............................................. 228/4.5
[58] Field of Search .................................. 228/102, 103, 228/105, 180.5, 4.5, 8, 9, 56.5

[56]             References Cited

U.S. PATENT DOCUMENTS

| | | | |
|---|---|---|---|
| 4,203,132 | 5/1980 | Schmitt et al. | 358/101 |
| 4,674,670 | 6/1987 | Watanabe et al. | 228/105 |
| 4,759,073 | 7/1988 | Shah et al. | 228/4.5 |
| 4,763,827 | 8/1988 | Watanabe et al. | 228/105 |
| 4,913,335 | 4/1990 | Yoshida et al. | 228/105 |
| 5,030,008 | 7/1991 | Scott et al. | 356/394 |
| 5,097,406 | 3/1992 | Narashimhan et al. | 228/105 |
| 5,356,065 | 10/1994 | Kobayashi | 228/4.5 |

FOREIGN PATENT DOCUMENTS 0480452    4/1992    European Pat. Off. .
3-48434    3/1991    Japan .

*Primary Examiner*—Samuel M. Heinrich
*Attorney, Agent, or Firm*—Hayes, Soloway, Hennessey, Grossman & Hage

[57]              ABSTRACT

A wire bonding apparatus has an image pickup unit for obtaining image data of an image frame of a square area encompassing wire bond objects including electrode pads of an IC chip and corresponding inner leads of a lead frame. The image of the square area is picked up at the bonding station where the bonding operation is executed. The image data is transmitted to an image processing unit, which detects the position of each of inner leads and electrode pads and calculating deviations of position of each of wire bond objects from corresponding design position stored in a memory unit. A control unit controls XY-table based on the deviations to align a bonding tool to each of the bonding points of the wire bond objects. In the case of lead frames, tape carriers or ceramic packages, the accuracy of wire bonding can be improved without being affected by deformation of the inner leads due to transportation, thermal deformation thermal expansion, or vibration remaining in the image pickup unit. In addition, the amount of time required for the detecting operation can be reduced.

3 Claims, 13 Drawing Sheets

WIRE BONDING APPARATUS

BACKGROUND OF THE INVENTION

1. Field of the Invention:

The present invention relates to a wire bonding apparatus used for fabricating a semiconductor integrated circuit (hereinafter referred to as an "IC") device.

2. Description of the Related Art:

Wire bonding apparatus is used for manufacturing an IC device in a final stage of the fabrication thereof. A conventional wire bonding apparatus will be described below with reference to drawings.

FIGS. 1 and 2 show plan views each illustrating a general configuration of an IC chip and a lead frame before or after bonding operation is performed thereto. FIG. 3 shows a cross-sectional view along line A—A' of FIG. 2, while FIG. 4 shows a plan view of a lead frame in which a plurality of IC chips are fabricated.

In FIGS. 1 through 3, the IC chip 6 has been fixed, prior to a bonding operation onto the lead frame 11, in a region surrounded by inner leads 5 for connection of the electrode pads 7 of the IC chip 6 with the inner leads 5 of an IC package by wires 20. As shown in FIG. 4, a plurality of IC chips 6 are successively arranged on a single lead frame 11 at a constant pitch for a mass production. Position marks 21a and 21b both serving as reference coordinates for the positions of all of the inner leads 5 are provided for corresponding one of the IC chip 6. Tips of some of the inner leads 5 may be used as a substitute for the position marks 21a and 21b. The IC chip 6 also has position marks 7a and 7b each constituted by an electrode pad as shown in FIG. 1.

In a conventional wire bonding apparatus for bonding the electrode pads 7 of the IC chips 6 with the inner leads 5 of the lead frame 11 as described above, a detection camera for detecting position of each of wire bond objects including electrode pads 7 and corresponding inner leads 5 is generally fixed to an XY-table moving in a horizontal direction, on which a bonding head is mounted. Before a bonding operation is carried out, the detection camera is successively moved by the XY-table to a location right above each of the position marks 7a, 7b, 21a and 21b and the bonding point of each of the inner leads 5 so as to store the coordinates of each of the electrode pads 7 and the inner leads 5. Thereafter, a wire bonding operation is carried out while moving the bonding head by the XY-table based on the stored coordinates.

FIG. 5 shows a detail of a portion of an area encompassing wire bond objects including the inner leads 5 and the electrode pads 7 of FIG. 1. In the region as shown by FIGS. 1 and 5, a detection camera is first moved to each of the positions of specific electrode pads 7a and 7b serving as reference coordinates of the IC chip 6. Subsequently, the detection camera is moved to a bonding point 28b of an endmost inner lead 5b to detect the coordinates of the bonding point 28b of the specific inner lead 5b. The detection camera is then moved to a next bonding point 28c of another inner lead 5c adjacent to the inner lead 5b to detect the coordinates of the bonding point 28c of the adjacent inner lead 5c. In a similar manner, the detection camera is successively moved to detection points 28 of other inner leads 5 to detect their coordinates.

In a conventional wire bonding apparatus as described above, the detection of the position or coordinates of the bonding point of the electrode pads and each of the inner leads by using the detection camera cannot be carried out simultaneously with a bonding operation for the electrode pads and the inner lead. In a recent IC package, lead frames, ceramic packages, tape carriers are employed in which a large number of pins are involved, hence the allowable deviation of each inner lead from a design position thereof is very small because of the small dimension of the inner lead. Consequently, detecting the coordinates of each of the bonding points of a large number of inner leads consumes a significant amount of time, resulting in a decrease of the efficiency of wire bonding.

For example, the amount of time required for detecting the bonding point of each inner lead is about 0.08 second, so that it takes a total amount of about 24 seconds to detect coordinates for all of the inner leads of each IC chip in the case where the IC chip has as many as 300 pins. The total amount of time of 24 seconds consumed for detecting the inner lead of each IC is significant in the field of the wire bonding apparatus affecting the productivity of IC device.

In a wire bonding apparatus disclosed in JP-A-3(1991)-48434, which is shown in FIG. 6 as a cross-sectional view thereof, two detection cameras 10c and 10d are mounted on an XY-table 2b onto which a bonding head 4 holding a bonding tool 3 is mounted. The first camera 10c is used for detecting the bonding point of each of inner leads at a region above a one-pitch upstream station 12 located one-pitch upstream from a bonding station 13, while the second camera 10d is used for detecting the positions of electrode pads at a whole at a region above the bonding station. The first camera 10c for the inner leads is mounted for horizontal movement relative to the XY-table 2b so that the distance in a horizontal direction between the first camera 10c and the bonding tool 3 can be adjusted, while the second camera 10d for electrode pads is fixed to the XY-table 2b. In FIG. 6, 1 denotes a machine base, 9c denotes an optical system for the detection cameras 10c and 10d, 14 denotes an image processing unit, 16 denotes a control unit, 17 denotes an ITV monitor, 18 denotes supporting members, and 25 denotes image signals.

Simultaneously with a bonding operation of an IC chip by the bonding tool 3, the bonding points of each of inner leads of a succeeding IC chip are detected by the first camera 10c. Hence, the position detecting operation for the inner leads and the wire bonding operation are overlapped with each other in adjacent two IC chips. This increases the efficiency of the bonding operation, thereby improving the productivity of the IC device.

SUMMARY OF THE INVENTION

An object of the present invention is to provide a wire bonding apparatus capable of improving the accuracy in detecting bonding points of inner leads and electrode pads, and reducing the amount of time required for detection of the bonding points.

A wire bonding apparatus of the present invention comprises a bonding tool, an XY-table, an image pickup unit, a memory unit, an image processing unit, and a control unit. The image pickup unit picks up an image frame from an image pickup area encompassing all of the wire bond objects for an IC chip including the electrode pads of the IC chip and corresponding inner leads of an IC package and outputs to the image processing unit image data regarding the image frame of the image pickup area. The memory unit stores first coordinate data representing design positions of all the electrode pads of the IC chip and the inner leads to be subjected to wire bonding.

The image processing unit receives the image data from the image pickup unit so as to detect, based on the image data and the first coordinate data by a pattern matching technique, the position of the wire bond objects to obtain second coordinate data for the wire bond objects. The image processing unit stores in the memory unit the second coordinate data representing the positions of the electrode pads of the IC chip and corresponding inner leads included in the image pickup area, and compares the second coordinate data with the first coordinate data so as to output deviations of the detected position of each of the wire bond objects from the design position of corresponding one of the design positions of the wire bond objects. The control unit receives data of the deviation and controls the XY-table based on the deviations to successively align the bonding tool to the bonding point of each of the wire bond objects.

In accordance with the present invention, an image frame is picked up at a bonding stage from an area encompassing the wire bond objects including the electrode pads of the IC chip and corresponding inner leads of the lead frame, and the image data obtained from the image frame is processed to detect the positions of the inner leads and the electrode pads. The accuracy in detecting bonding points can be improved because the detected bonding positions are not affected by deformation of the inner leads due to transportation, thermal deformation, thermal expansion, or vibration remaining in the image pickup unit. In addition, the amount of time required for detecting at least the inner leads can be reduced because the image pickup unit picks up an image frame of the area encompassing the wire bond objects at a time without successive movements or shifts of the XY-table.

BRIEF DESCRIPTION OF THE DRAWINGS

The above and further objects as well as features and advantages of the present invention will be more apparent from the following description, taken in conjunction with accompanying drawings in which.

DESCRIPTION OF THE PREFERRED EMBODIMENTS

Before describing embodiments of the present invention, disadvantages of the conventional wire bonding apparatus will be described for the sake of understanding of the present invention.

Figure 6:
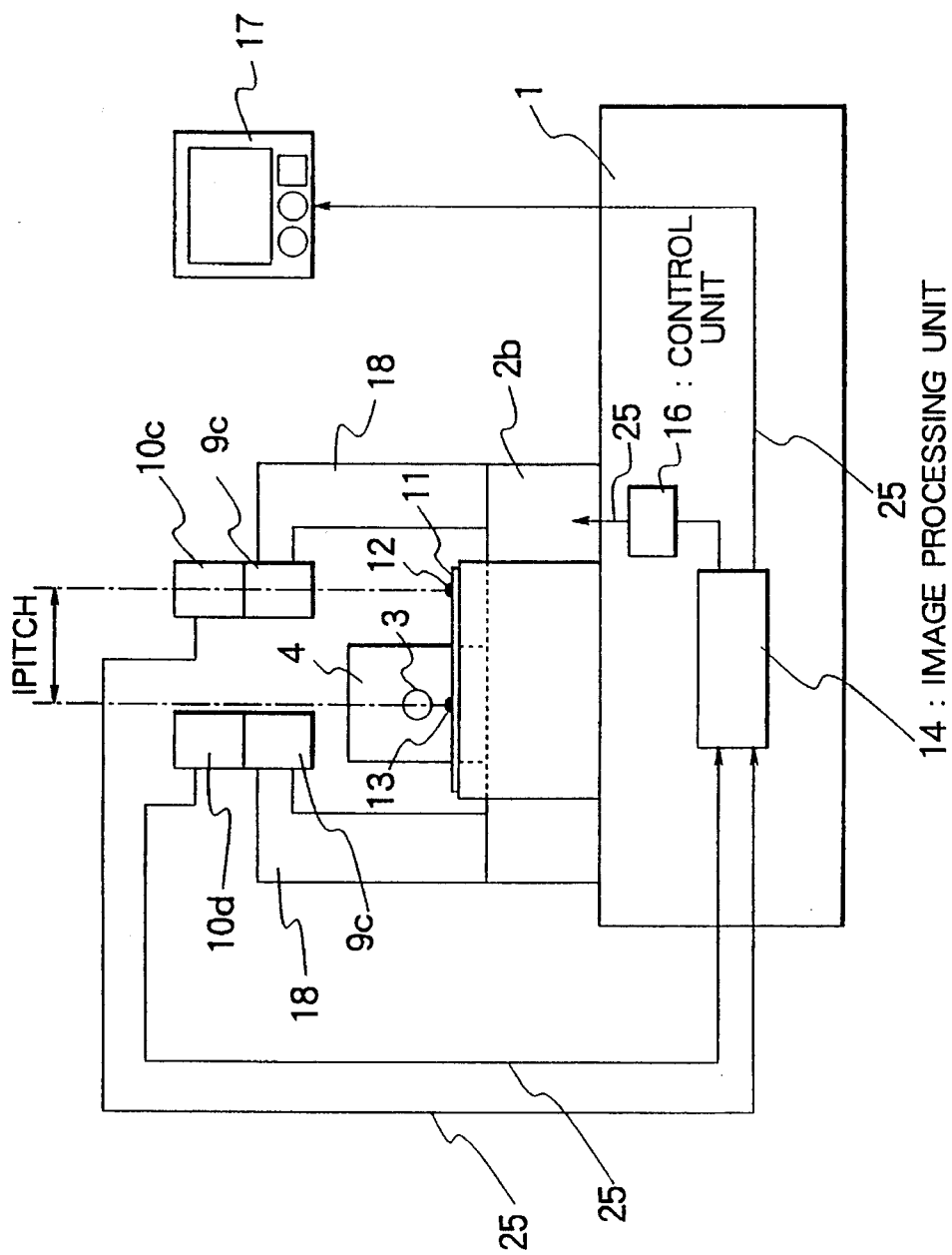
FIG. 6 is a schematic side view illustrative of a conventional wire bonding apparatus.
Figure 7:
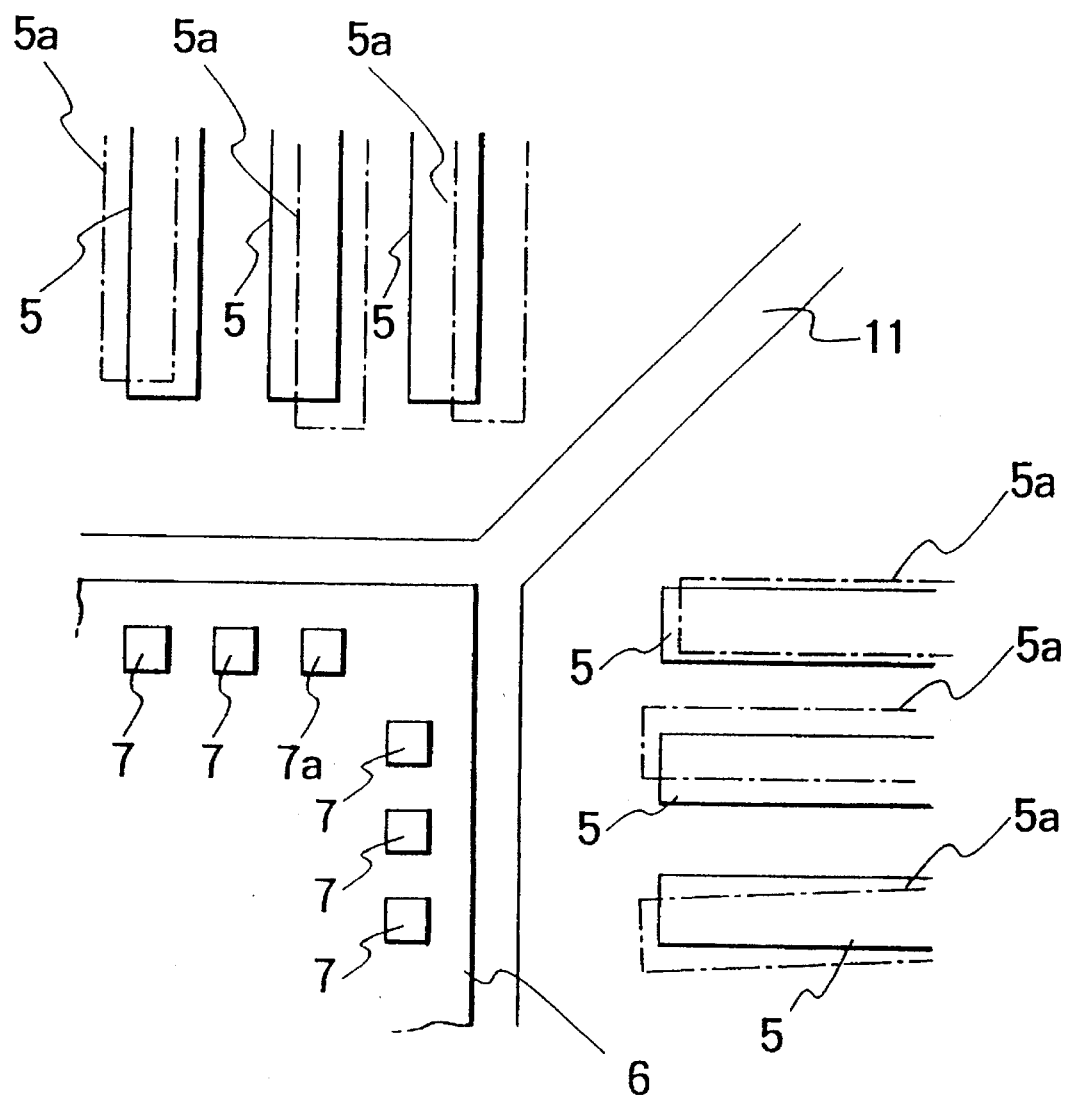
FIG. 7 is a explanatory view for showing deformation of inner leads in FIG. 5.

In the wire bonding apparatus shown in FIG. 6, the coordinates of the inner leads are detected at the one-pitch upstream station 12 as described before. Accordingly, in the case where lead frames, tape carriers or the like are involved in which inner leads are made of materials liable to be deformed, the positions of the inner leads 5 detected at the one-pitch upstream station will actually deviate at the bonding station 13, as indicated by dotted lines 5a in FIG. 7, after the inner leads 5 are transferred from the one-pitch upstream station 12.

Consequently, when a wire bonding operation is performed at the coordinates detected at the one-pitch upstream station 12, the bonding points will deviate from the design bonding points of the inner leads 5. Therefore, there is a possibility that proper connections cannot be obtained by the bonding operation.

Moreover, in many cases, the stage temperature at the one-pitch upstream station 12 is generally lower than the stage temperature at the bonding station 13 in which wire bonding is executed. In such cases, even in a case wherein ceramic packages are used, thermal deformation and thermal expansion will be produced in each inner lead 5 due to the higher temperature at the bonding stage 13. Accordingly, the bonding points of the inner leads detected at the one-pitch upstream station deviate further more from the design bonding points of the inner leads, rendering the bonding operation to be more difficult, and rendering it difficult to maintain the reliability of connections formed by the bonding operation.

Furthermore, since each of the inner leads 5 and the electrode pads 7 is detected immediately after a sudden stop of the XY-table, which has been moved at a high speed during wire boning operations for successive bonding points, mechanical vibrations remain in the detection cameras and the support members therefor. Accordingly, affections by the mechanical vibrations on the detecting operation cannot be avoided, thereby the accuracy of the position detection being deteriorated.

Especially, in case of lead frames or tape carriers having a large number of pins, the allowable deviation of each of the bonding points from corresponding one of the design bonding points of the inner leads is very small because of the small dimensions especially in width of the inner leads. Accordingly, it is difficult to maintain the reliability of connections by bonding due to deviation of the bonding points.

For example, it is assumed that the dimension of each inner lead 5 is about 0.10 mm in width in the case of a large number of pins, e.g. about 300 pins, and the allowable deviation in coordinates for wire bonding is about ±0.01 mm. The amount of deformation of each inner lead resulting from the above reasons amounts to as high as about ±0.02 mm ±0.01 mm.

Accordingly, although the amount of the deformation of each of the inner leads must be smaller than the allowable deviation of the bonding point in the wire bonding operation, it is likely to happen that the amount of deviation of the bonding point is larger than the allowable deviation of the bonding point, resulting in that the wire bonding by the conventional method cannot provide a satisfactory quality of bonding.

Now, embodiments of the present invention will be described with reference to the drawings.

Figure 8:
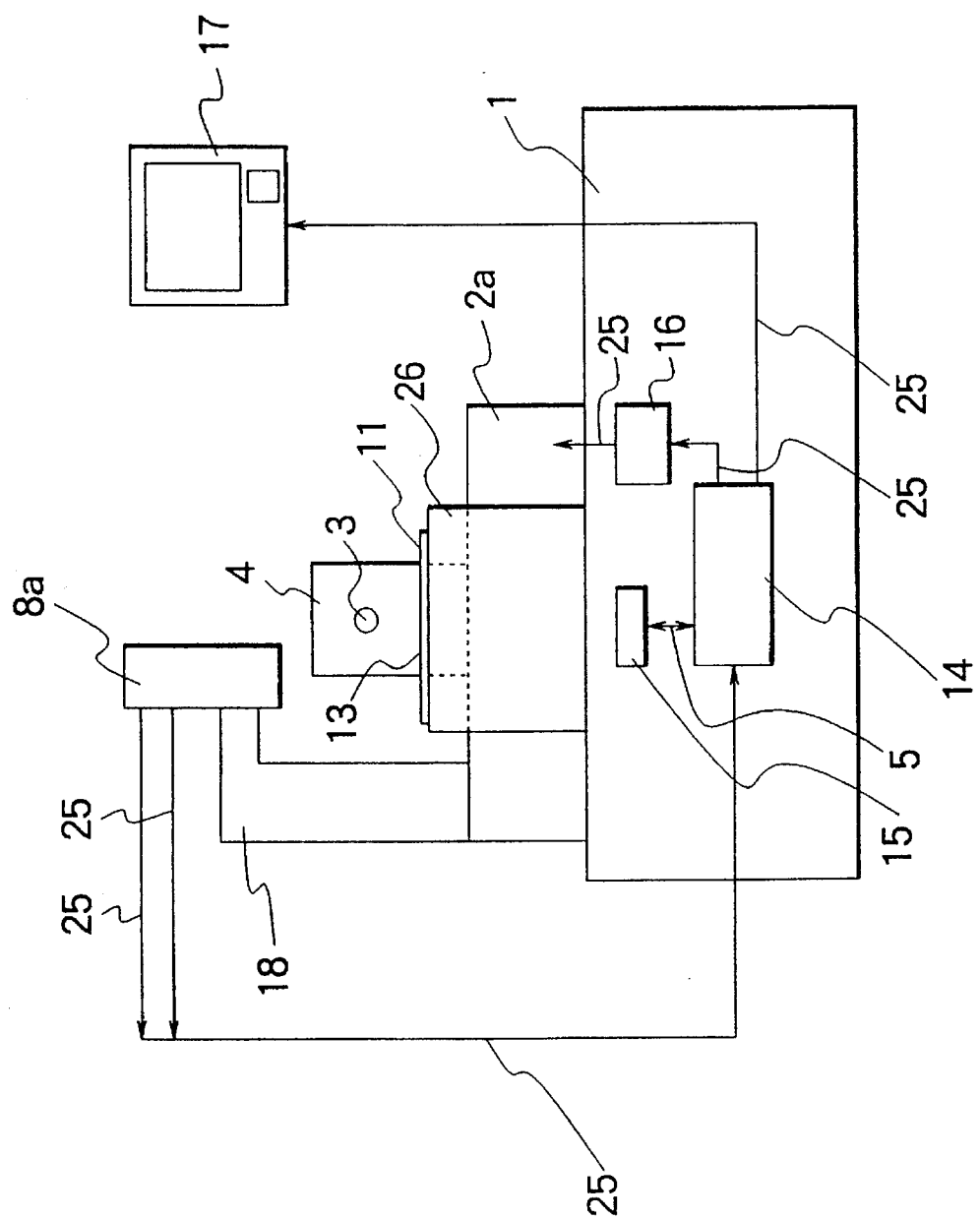
FIG. 8 is a side view of a wire bonding apparatus according to a first embodiment of the present invention.

FIG. 8 schematically shows a wire bonding apparatus according to a first embodiment of the present invention. The wire bonding apparatus of the present embodiment performs a bonding operation for the lead frame shown in FIG. 1 as wire bond objects, i.e., objects to which wire bonding is performed. The wire bonding apparatus is comprised of an XY-table, a bonding head 4 mounted on the XY-table, a bonding tool 3 releaseably secured to the bonding head 4, an image pickup system including an image pickup unit 8a, image processing unit 14 and a memory unit 15, and a control unit 16 for controlling the XY-table. The memory unit 15 stores therein coordinates of the design positions of all of the inner leads 5 and the electrode pads 7 of each type of IC chips.

The bonding head 4 is mounted on the XY-table 2a which is mounted on a machine base 1 for movement in a horizontal direction. A lead frame 11 having inner leads 5 (FIG. 1) thereon is releaseably secured to a carrier unit 26 by way of a fixing tool and transferred by the carrier unit 26 one pitch by one pitch. The image pickup unit 8a is secured to the XY-table 2a by way of a support member 18 for pickup of the image of inner leads 5 of the lead frame 11 and for electrode pads 7 on an IC chip 6 die-bonded to the lead frame 11.

Figure 9:
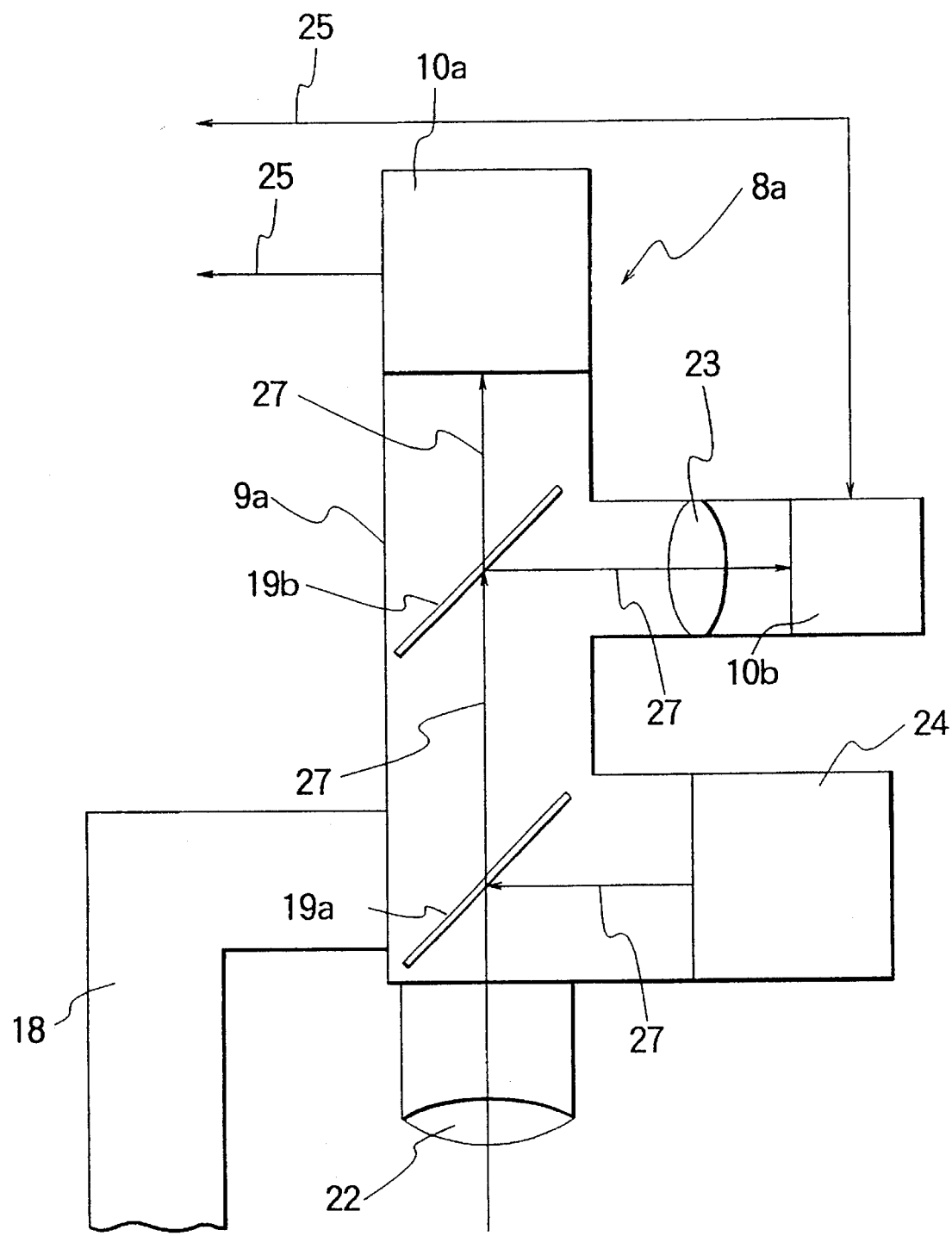
FIG. 9 is a partial enlarged side view of the wire bonding apparatus of FIG. 8.

Referring to FIG. 9, the image pickup unit 8a is comprised of a first camera 10a, a second camera 10b and an optical system 9a. The optical system 9a includes an objective lens 22, a first half mirror 19a, a second half mirror 19b, a magnification lens 23 and a light source 24. The first camera 10a is disposed in the upper end of the optical system 9a, while the second camera 10b is disposed in the middle portion of the optical system 9a. The optical system 9a supplies to the first and second cameras 10a and 10b image of a square area encompassing the wire bond objects including all of the electrode pads 7 of the IC chip 6 and corresponding Inner leads 5 of the lead frame 11. The first camera 10a picks up an image frame from a large square area of about 22 mm×22 mm, so that the objective lens 22 is of a high resolution type and scarcely produces any significant distortion in the image of the square area resulting from aberration or the like.

The first half mirror 19a is disposed in the lower portion of the optical system 9a to lead a light beam 27 from the light source 24 to the square area. The second half mirror 19b is disposed above the first half mirror 19a, receives the image of the wire bond objects passing through the fist half mirror 19a, and provides the image of the wire bond objects to the first camera 10a. The magnification lens 23 is disposed between the half mirror 19b and the second camera 10b to obtain a magnified image of a portion of the square area for the second camera 10b.

Before executing of a wire bonding operation, the first camera 10a first picks up an image frame from a square area encompassing the wire bond objects. Image data thus obtained by the first mirror 10a is transmitted to the image processing unit 14 for obtaining the position of each of inner leads 5.

Figure 4:
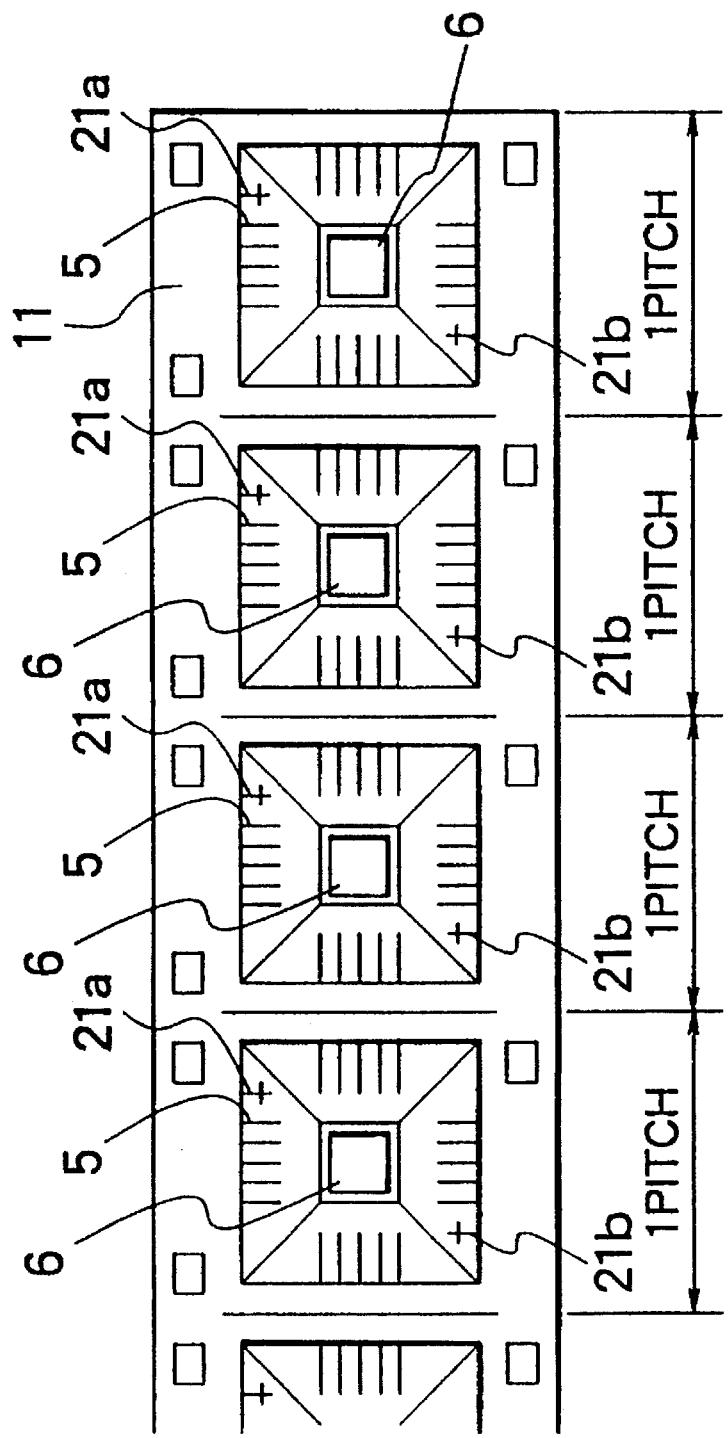
FIG. 4 is plan view illustrative of a plurality of IC chips and a lead frame for showing a general arrangement of the IC chips in a bonding step.
Figure 5:
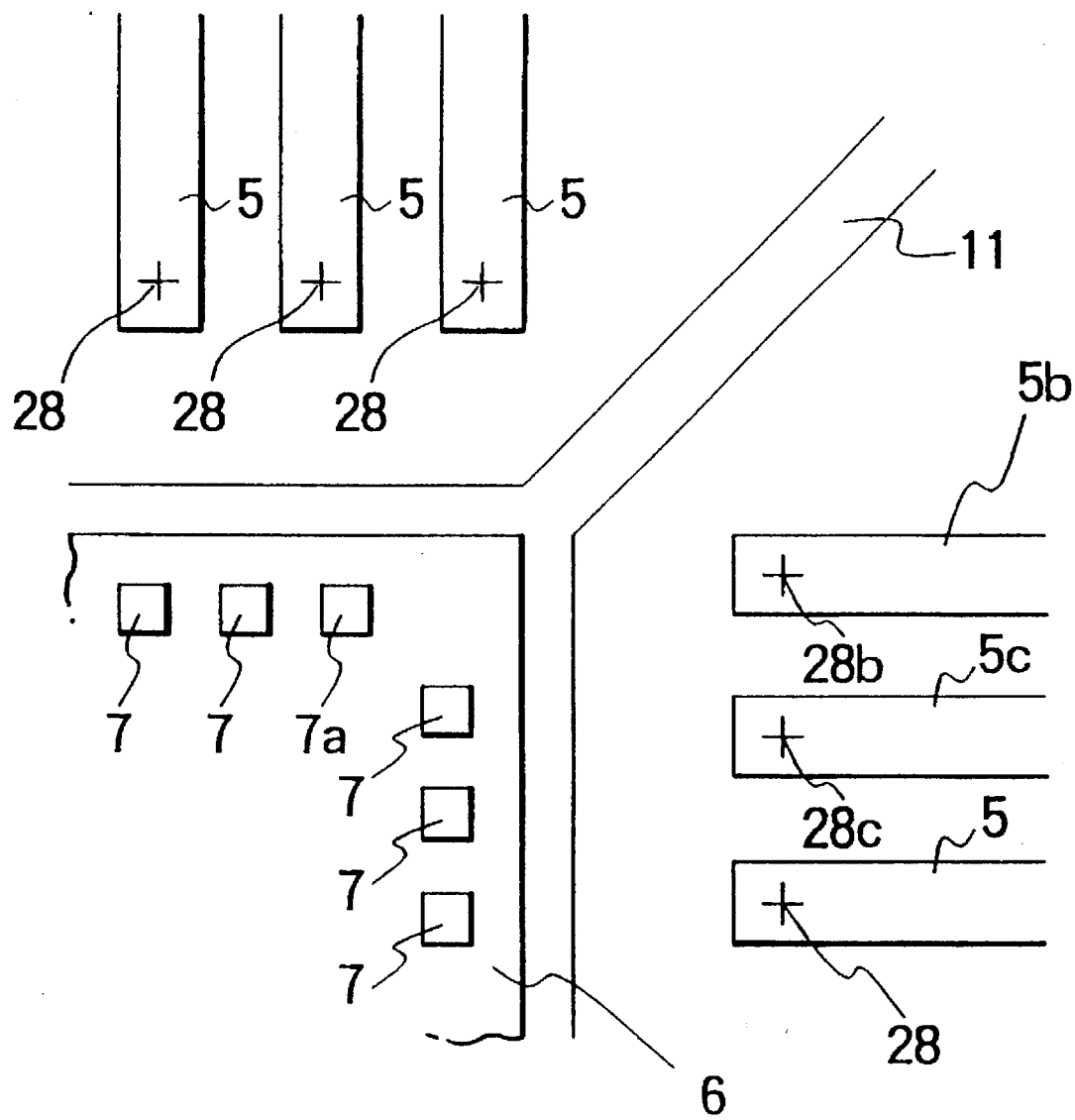
FIG. 5 is a partial enlarged plan view of FIG. 1.

The second camera 10b functions for monitorring the wire bond objects enterring the bonding station. The second camera 10b also detects the position marks 21a and 21b of the IC chips as shown in FIG. 4 while being driven by the XY-table. The second camera 10a transmits the image data thus detected to the image processing unit 14. The image data received by the image processing unit 14 is used for identifying the exact position of the IC chip.

The image processing unit 14 includes an identifying section for identifying each of wire bond objects to obtain second coordinates of the wire bond objects, and a deviation calculation section for calculating deviation of each of the detected bonding points from the design bonding points. The deviation calculation section calculates differences between the design coordinates of each of the inner leads 5 and the electrode pads 7 and corresponding one of the detected positions of all of the inner leads 5 and the electrode pads 7, then transmits the resultant differences or deviations to the control unit 16. The image processing unit 14 is also connected to an ITV monitor 17 for visual monitorring of the wire bond objects.

The control unit 16 compensates the amounts of movement of the XY-table 2a for executing a wire bonding operation for each of bonding points based on the deviations as obtained above, and controls the bonding tool 3 to carry out the wire bonding operation For each of the bonding point while moving the XY-table 2a in accordance with compensated values.

Figure 10:
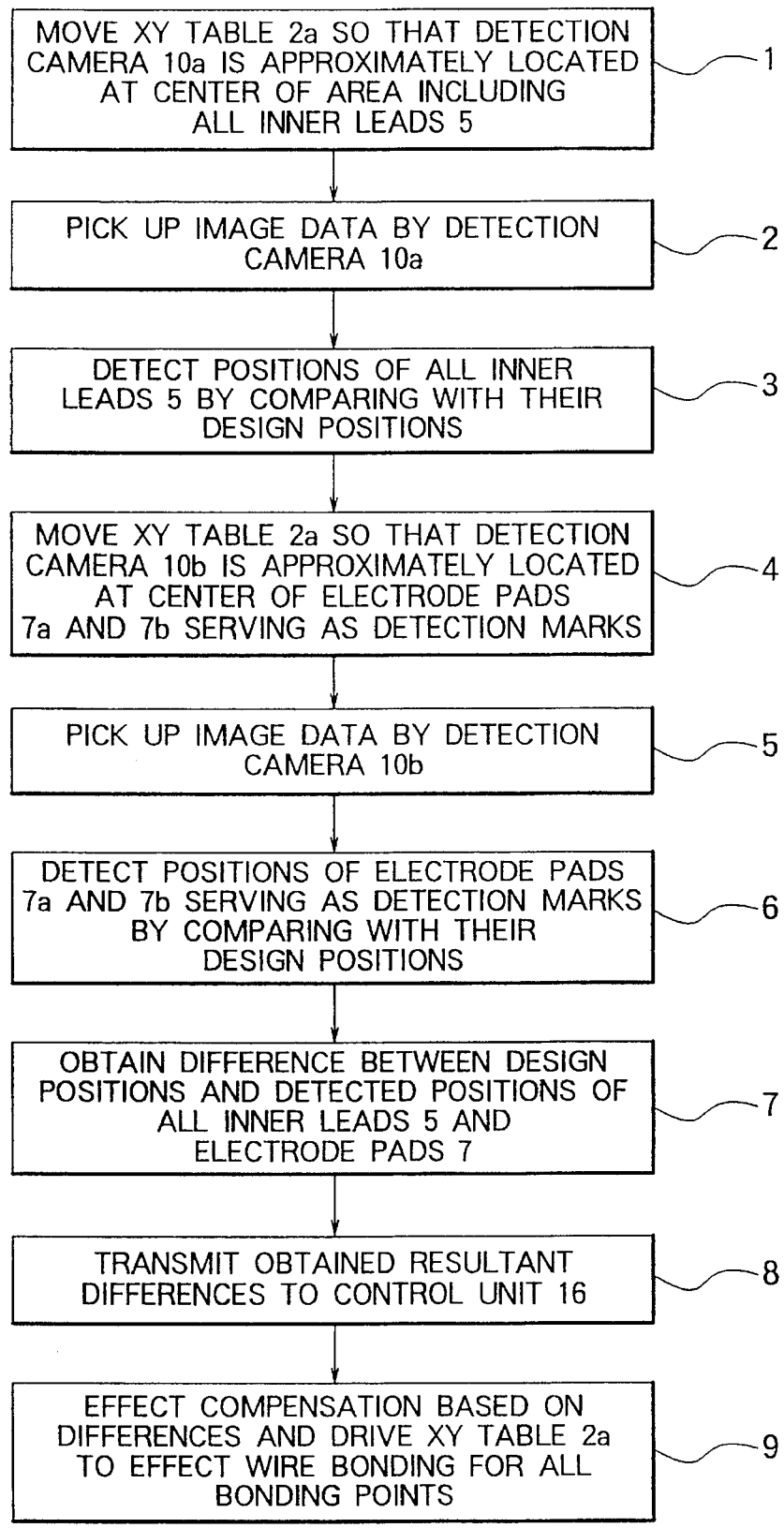
FIG. 10 is a flow-chart showing an operation by the wire bonding apparatus of FIG. 8.

Next, operation of the wire bonding apparatus of the present embodiment will be described in detail with reference to FIG. 10.

In step 1, the XY-table 2a is moved so that the center of the objective lens 22, i.e., center of the first camera 10a is located on a perpendicular passing through the center of the image pickup area encompassing the wire bond objects including all of the electrode pads 7 of the IC chip 6 and corresponding inner leads 5 of the lead frame 11.

In step 2, image data representing an image frame of the image pickup area is picked up by the first camera 10a.

In step 3, the image data is transmitted from the first camera 10a to the image processing unit 14 as a signal 25. The image processing unit 14 performs an image detection operation while comparing each of the inner leads 5 in the image data with corresponding one of the data for the design positions of all of the inner leads 5 for the IC chip, which are stored in the memory unit 15 in advance, to detect the exact positions of the inner leads 5.

In step 4, the XY-table 2a is successively moved so that the center of the objective 22, i.e., the center of the field of view for the second camera 10b is located on a perpendicular of the surface of the IC chip at substantially the center of the electrode pad 7a and then center of the electrode 7b, both serving as position marks.

In step 5, the image data of the electrode pads 7a and 7b are successively picked up by the detection camera 10b and transmitted from the second camera 10b to the image processing unit 14.

In step 6, the image processing unit 14 detects the position of the position marks 7a and 7b and transmits the detection signal to the control unit 25, which identifies the coordinates of the position marks 7a and 7b in view of the current coordinates of the XY-table. The coordinates of the position marks 7a and 7b of the IC chip 6 are then transmitted to the image processing unit 14.

In step 7, the image processing unit 14 obtains differences between each of the design coordinates of all of the inner leads 5 stored in the memory unit 15 and corresponding one of the detected coordinates of all of the inner leads 5. The image processing unit 14 further obtains the difference between the coordinates of the electrode pads 7a and 7b and the corresponding data stored in the memory unit 15 to thereby calculates the deviations of the IC chip from the design positions thereof. The image processing unit further calculates deviations of the positions of all of the electrodes 7 of the IC chip 7 from corresponding design positions stored in the memory units 15.

In step 8, the resultant deviations are transmitted to the control unit 16.

In step 9, the control unit 16 controls for driving the XY-table 2a based on each of the deviations thus obtained, and carries out a wire bonding operation at each bonding point by using the bonding tool 3, while moving the XY-table 2a to align the bonding tool 3 to each bonding point.

The accuracy of the wire bonding operations can be improved by the above described manner in which the images for the inner leads are obtained at a time as an image frame of the square area encompassing the wire bond objects including the inner leads 5 for obtaining each of the coordinates of the inner leads 5. Accordingly, the amount of time required for the detecting operation can be reduced.

When a two-dimensional charged coupled device (CCD) image sensor of a high resolution type is used in the present embodiment, for example, as an image pickup element of the first camera 10a, and the CCD has 512 picture elements along each of both sides, the number of picture elements in each piece of the first image data is 512×512. Assuming that the area from which an image is picked up is 22 mm×22 mm, and that a multivalued image processing is carried out in the image processing unit, a resolution of one tenth of the picture element ($3\sigma$) can be obtained. Accordingly, deviations of the detected positions from the corresponding exact positions can be obtained as follows:

$$\pm 22 \div 512 \times \frac{1}{10}(3\sigma) = \pm 0.004 \text{ mm } (3\sigma).$$

From the above, a satisfactory small deviation in the position of each of the inner leads can be obtained as compared to an allowable deviation even in the case of a large number of pins, e,g, about 300 pins. Namely, an error produced by the wire bonding apparatus of the present embodiment in measurement of each of the positions of inner leads is significantly smaller than allowable deviation of wire bonding, thereby obtaining a sufficient accuracy for an IC chip.

In a practical wire bonding operation, the total amount of time required for detecting the coordinates of the wire bond objects encompassed by the image pickup area was 3 seconds per an IC chip, substantially irrespective of the number of pins of the IC chip. Accordingly, the amount of time can be calculated at about 0.01 second per inner lead in the case of IC chips having 300 pins, the amount of time being significantly reduced as compared to about 0.08 second per inner lead in the conventional wire bonding apparatus.

As described above, the wire bonding apparatus of the present embodiment can reduce the amount of time for image detection, and carry out wire bonding operation with a higher productivity.

Figure 11:
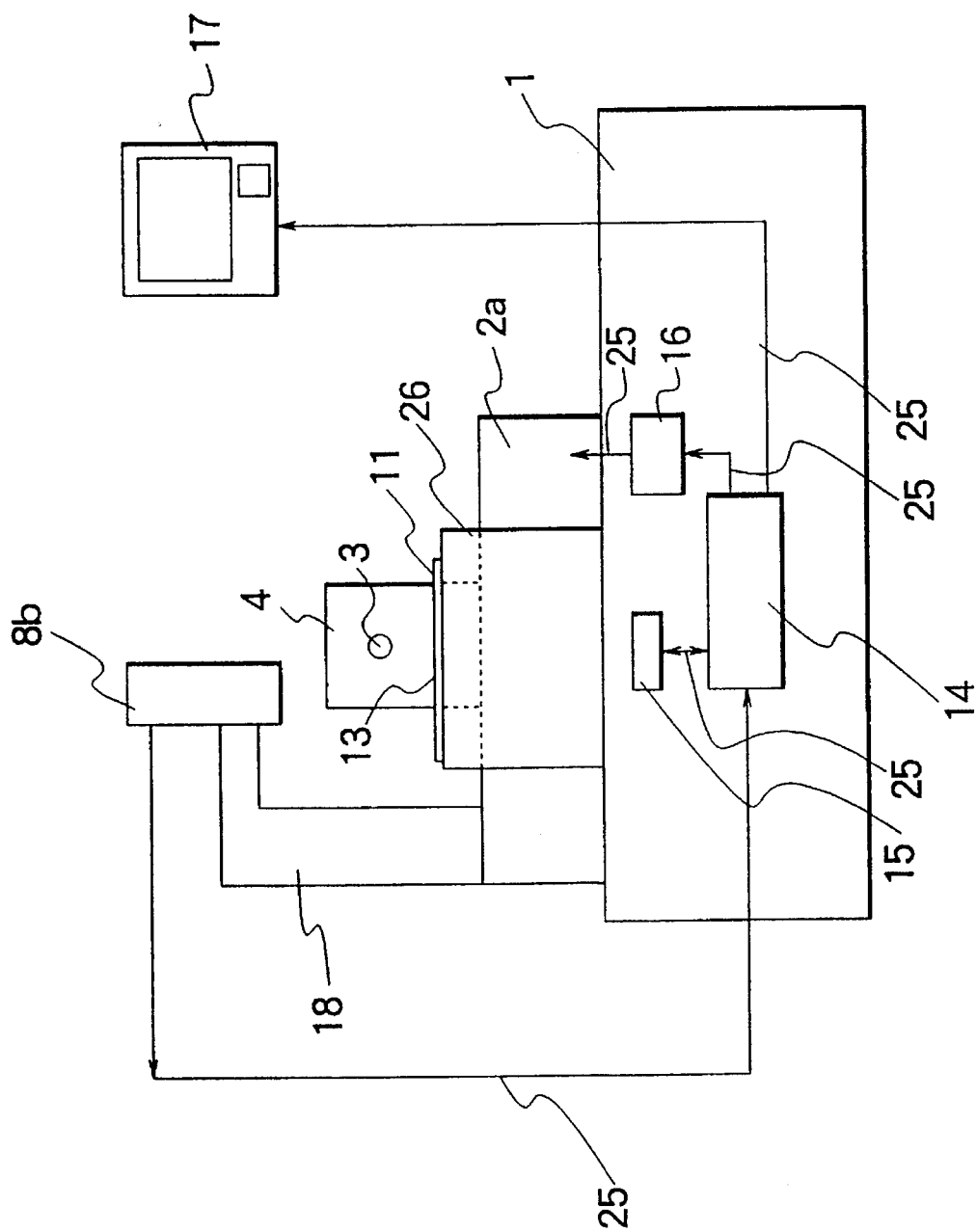
FIG. 11 is a side view illustrative of a wire bonding apparatus according to a second embodiment of the present invention.
Figure 12:
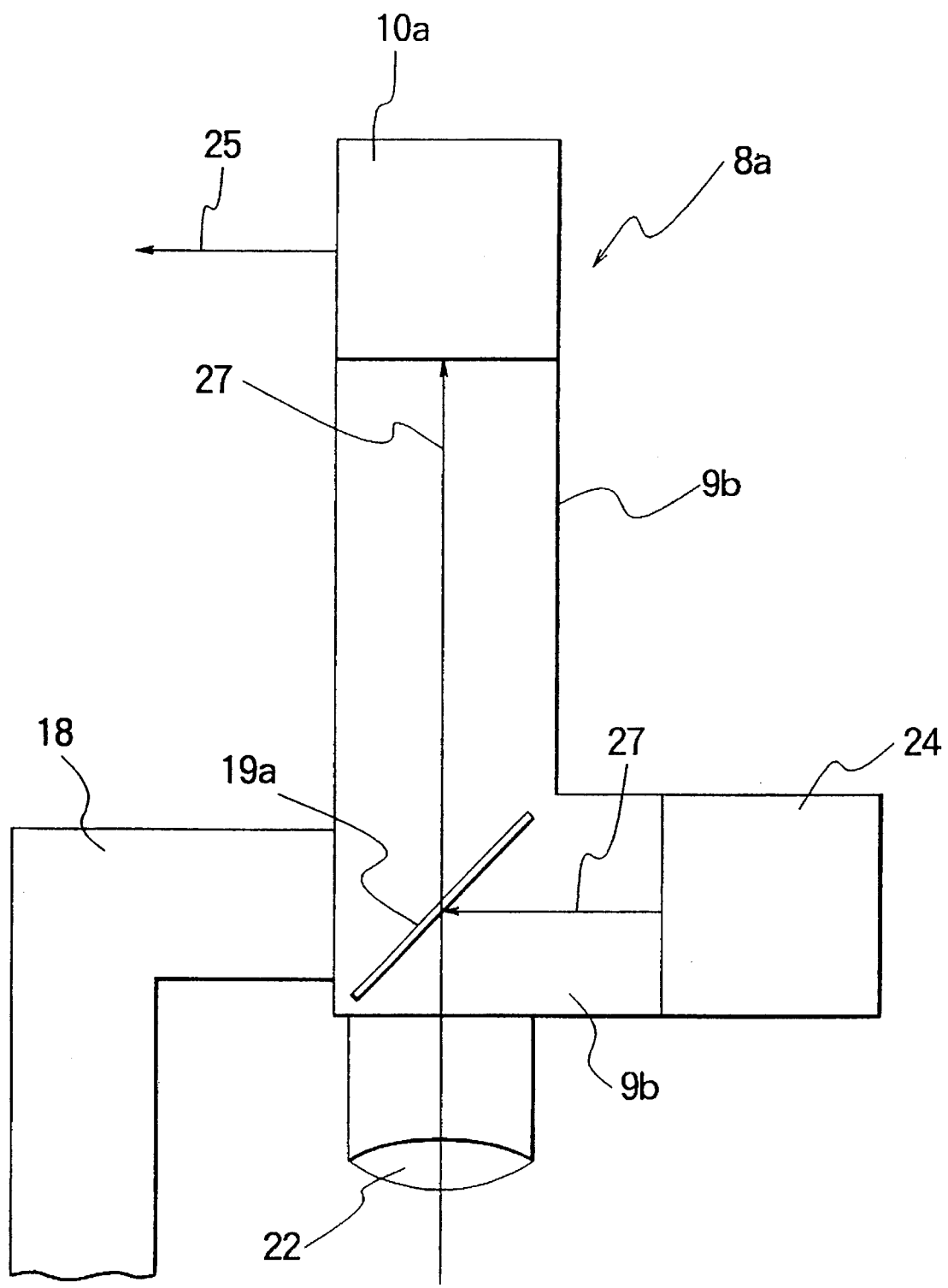
FIG. 12 is a partial enlarged side view of the wire bonding apparatus of FIG. 11.

Referring to FIG. 11, a wire bonding apparatus according to a second embodiment of the present invention has a configuration similar to that of the first embodiment, with the exception that the image pickup unit 8b is comprised of a single camera for detecting positions of each of inner leads and electrode pads, as shown in FIG. 12. The rest of the components in FIG. 11 other than the image pickup unit 8b are denoted by the same reference numerals as those of respective components of the wire bonding apparatus of FIG. 8, and the detailed description thereof will not be made here for avoiding duplication.

Figure 1:
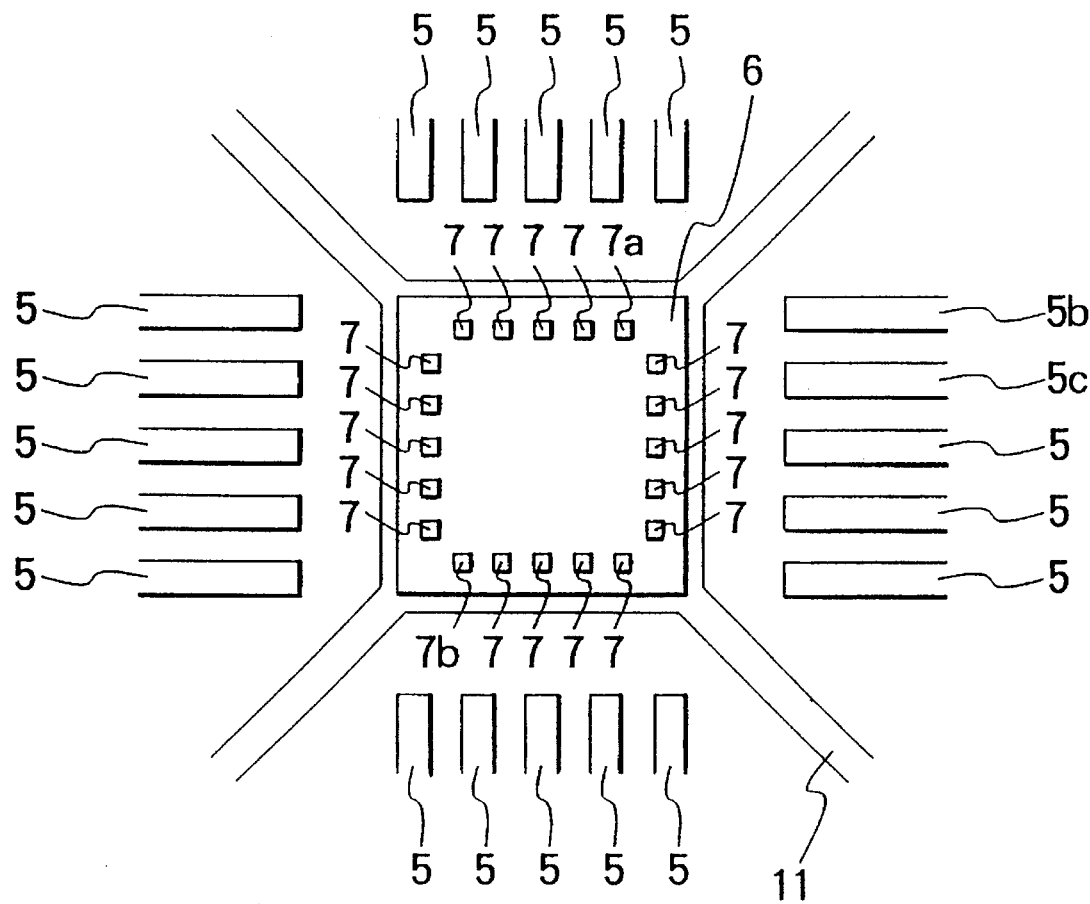
FIG. 1 is schematic plan view illustrative of an IC chip and a lead frame before wire bonding operation.
Figure 2:
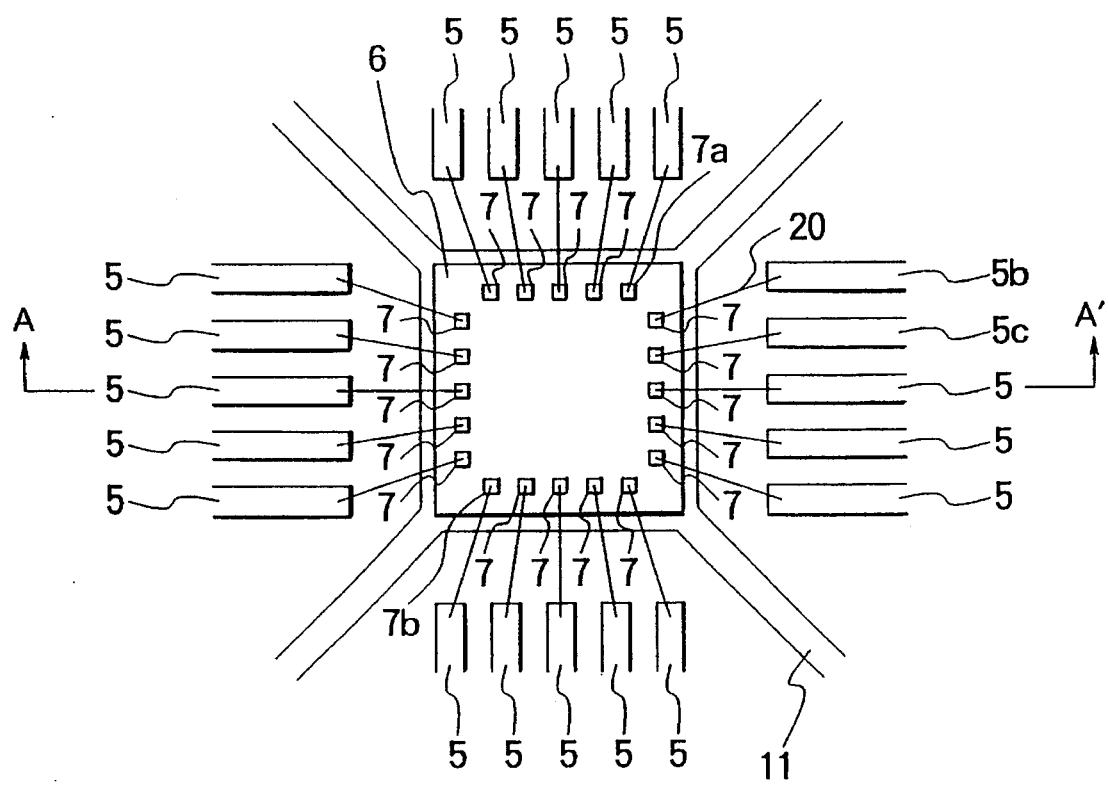
FIG. 2 is a schematic plan view illustrative of the IC chip and the lead frame of FIG. 1 after wire bonding operation.
Figure 3:
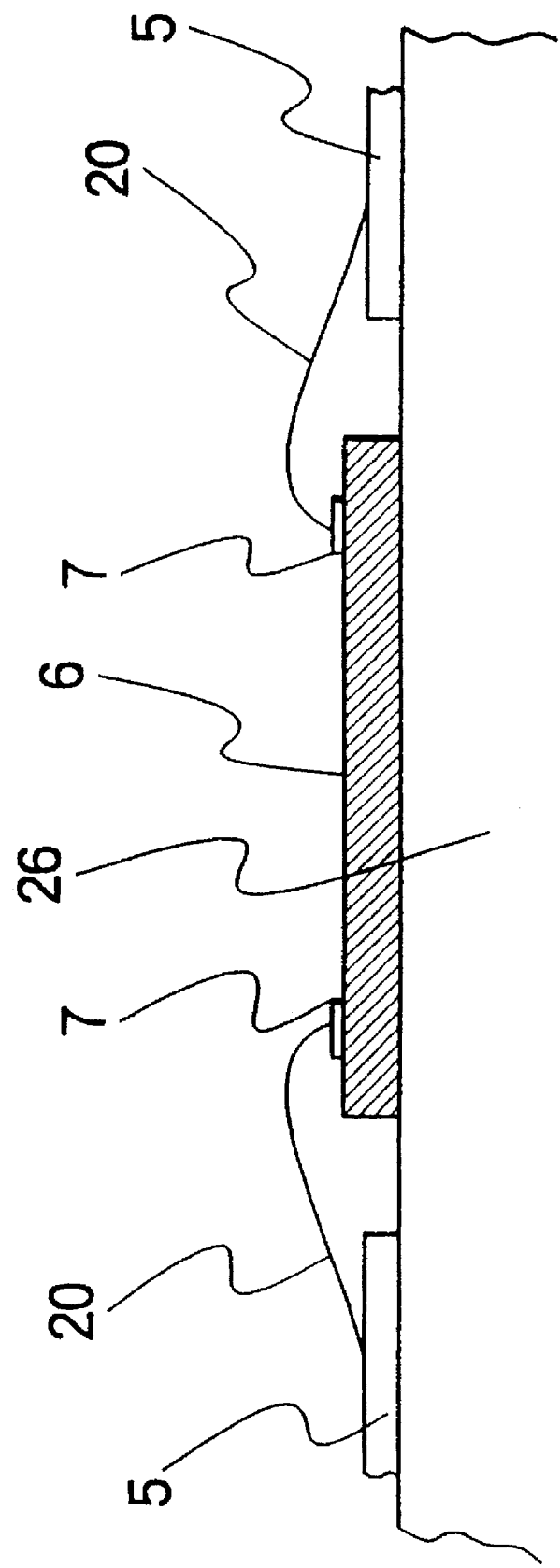
FIG. 3 is a cross-sectional view illustrative of the IC chip and the lead frame of FIG. 2 along line A—A' in FIG. 2

Referring to FIG. 12, the image pickup unit 8b is comprised of a single detection camera 10a and an optical system 9b for supplying the detection camera 10a with the image of a square area encompassing wire bond objects including electrode pads 7 of an IC chip 6 and corresponding inner leads 5 of a lead frame 11 such as shown in FIG. 1. The optical system 9b is comprised of an objective lens 22, a half mirror 19a, and a light source 24. The half mirror 19a leads a light beam 27 received from the light source 24 towards wire bond objects and also passes an image of the image area encompassing the wire bond objects upwards to the detection camera 10a.

The detection camera 10a is disposed above the half mirror 19a and picks up an image frame of the square area encompassing the wire bond objects, before the bonding tool 3 executes a wire bonding operation. Image data thus obtained is transmitted to the image processing unit 14.

The image processing unit 14 detects the positions of each of the inner leads 5 and the electrode pads 7 based on the image data obtained by the detection camera 10a, while comparing each of the detected coordinates of the inner leads with corresponding data of the design positions of the inner leads 5 stored in the memory unit 15 and also comparing coordinates of each of the electrode pads 7a and 7b with corresponding data of the design positions thereof. The image processing unit 14 then obtains a deviation between the detected position of each of the inner leads 5 and the electrode pads 7 and corresponding one of design positions of the inner leads 5 and the electrode pads 7 stored in the memory unit 15, then transmits the resultant deviation data to the control unit 16. The image processing unit 14 is also connected to an ITV monitor 17 for visual monitorring.

The control unit 16 compensates the amounts of movement of the XY-table 2a based on the deviations of the detected positions of all of the inner leads 5 and the electrode pads 7 from the corresponding design positions of the inner leads and the electrode pads 7 The control unit 25 controls the bonding tool 3 to carry out wire bonding on the inner leads 5 and the electrode pads 7, while moving the XY-table 2a in accordance with compensated amounts.

Figure 13:
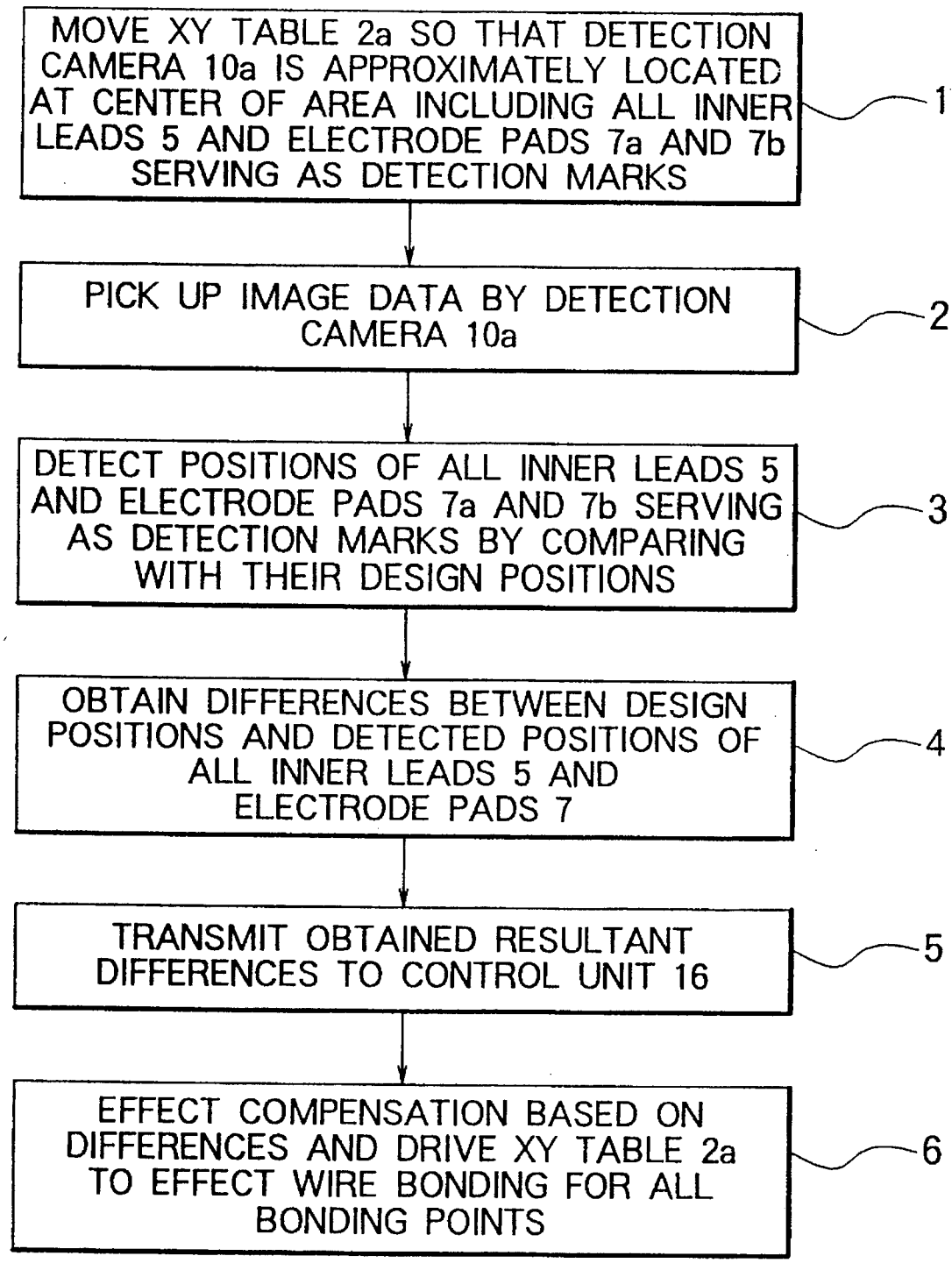
FIG. 13 is a flow chart showing an operation by the wire bonding apparatus of FIG. 11.

Next, operation of the wire bonding apparatus according to the present embodiment will be described with reference to FIG. 13.

In step 1, the XY-table 2a is moved so that the detection camera 10a is located on the perpendicular of substantially the center of the image pickup area located in a bonding station, the image pickup area encompassing wire bond objects including the electrode pads 7a and 7b of an IC chip 6 and corresponding inner leads 5 of the lead frame 11 such as shown in FIG. 1. The electrode pads 7a and 7b functions for position marks for the IC chip, which is bonded to the lead frame beforehand by die bonding and transferred to the bonding station prior to the wire bonding.

In step 2, an image frame of the image pickup area is picked up by the detection camera 10a. The image data thus obtained is transmitted from the detection camera 10a to the image processing unit 14.

In step 3, the image processing unit 14 performs an position detection of each of the inner leads 5 and two of the electrode pads 7 while comparing the obtained position data with the corresponding coordinates of each of the inner leads 5 and the electrode pads 7a and 7b serving as position marks, which are stored in the memory unit 15 in advance, thereby detecting the wire bonding positions for all of the inner leads 5 and all of the electrode pads 7 of the IC chip.

In step 4, the image processing unit 14 obtains deviations of the detected positions of all of the inner leads 5 and the electrode pads 7 from the design positions of all of the inner leads 5 and the electrode pads 7.

In step 5, the resultant deviations are transmitted to the control unit 16.

In step 6, the control unit 16 compensates the amounts of movement of the XY-table 2a based on the resultant deviations, and controls the wire bonding tool to carry out wire bonding at all bonding points, while moving the XY-table 2a.

With the second embodiment, since a common camera 10a is used for the image pickup unit, the number of operation for movement of the XY-table for detecting the bonding position of the inner leads and the electrode pads is reduced to only one, thereby realizing reduction in the amount of time required for the detecting operation for the bonding points. Moreover, deviation of the inner leads from the detected positions does not arise, so that the accuracy in detecting the positions is improved.

Furthermore, the structure of the image pickup unit can be simplified, and the weight acting on the XY-table is reduced. This provides an additional advantage in cases where the speed of the bonding operation is increased through increasing the moving speed of the XY-table.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A wire bonding apparatus comprising:

a bonding tool for bonding wire to a bonding point of each of a plurality of wire bond objects including a plurality of electrode pads of an IC chip and corresponding inner leads of an IC package;

a moving table for moving said bonding tool to align said bonding tool to said bonding point;

an image pickup unit, mounted by said moving table, for picking up an image frame of an area encompassing said wire bond objects to obtain at a bonding station a combination of image data for all of positions of said wire bond objects;

a memory section for storing first coordinate data representing design position of each of said wire bond objects;

an image processing unit including an identifying section for identifying each of said wire bond objects based on said combination of image data to obtain second coordinate data representing the detected position of each of said wire bond objects, and a deviation calculation section for calculating deviation of each of said detected positions of said wire bond objects from corresponding one of said design positions by comparing said first coordinate data with said second coordinate data; and a control unit for controlling the movement of said moving table based on said deviation to align said bonding tool to each said bonding point for carrying out a bonding operation in said bonding station.

2. A wire bonding apparatus as defined in claim 1 wherein said image pickup unit includes a first camera for picking up said image frame and a second camera for determining the position of said IC chip.

3. A wire bonding apparatus as defined in claim 1 wherein said image pickup unit includes a charge coupled device image sensor.

* * * * *